US012725671B2

(12) United States Patent
Sim

(10) Patent No.: US 12,725,671 B2
(45) Date of Patent: Sep. 1, 2026

(54) HIGH VOLTAGE TRANSFER DEVICE AND A MEMORY DEVICE INCLUDING THE SAME

(71) Applicant: SAMSUNG ELECTRONICS CO., LTD., Suwon-si (KR)

(72) Inventor: Soung Hoon Sim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 37 days.

(21) Appl. No.: 18/636,542

(22) Filed: Apr. 16, 2024

(65) Prior Publication Data

US 2025/0095761 A1 Mar. 20, 2025

(30) Foreign Application Priority Data

Sep. 19, 2023 (KR) ........................ 10-2023-0125013

(51) Int. Cl.

*G11C 17/18* (2006.01)
*G11C 17/16* (2006.01)
*H03K 19/0185* (2006.01)

(52) U.S. Cl.

CPC .............. *G11C 17/18* (2013.01); *G11C 17/16* (2013.01); *H03K 19/018521* (2013.01)

(58) Field of Classification Search

CPC ......... G11C 17/18; G11C 17/16; G11C 17/12; G11C 5/147; H03K 19/018521
USPC ........................................................... 365/96
See application file for complete search history.

(56) References Cited

U.S. PATENT DOCUMENTS

| | | | |
|---|---|---|---|
| 7,515,503 | B2 | 4/2009 | Lee et al. |
| 9,219,482 | B2 | 12/2015 | Kwon et al. |
| 9,467,050 | B2 | 10/2016 | Lee et al. |
| 10,076,963 | B2 | 9/2018 | Yamaguchi |
| 10,158,288 | B2 | 12/2018 | Mengad |

(Continued)

FOREIGN PATENT DOCUMENTS

| | | |
|---|---|---|
| CN | 208272943 U | 12/2018 |
| KR | 19980074607 | 11/1998 |
| WO | WO 2019/013925 | 1/2019 |

OTHER PUBLICATIONS

Extended European Search Report in European Appln. No. 24167190.8, mailed on Apr. 21, 2024, 11 pages.

*Primary Examiner* — Amir Zarabian
*Assistant Examiner* — Minh Dinh
(74) *Attorney, Agent, or Firm* — Fish & Richardson P.C.

(57) ABSTRACT

An electronic device comprises a one time programmable (OTP) memory cell that includes a program transistor and a read transistor; and a high voltage transfer device configured to level-shift an external high voltage to an internal voltage, wherein the high voltage transfer device includes a first PMOS transistor having a first end connected to an external high voltage terminal, a second PMOS transistor having a first end connected to a second end of the first PMOS transistor and a second end connected to a gate of the program transistor, an enable circuit configured to receive an enable signal and generate a gate voltage of the second PMOS transistor, and a level shifter connected to the enable circuit by a feedback path and configured to generate a gate voltage of the first PMOS transistor based upon the gate voltage of the second PMOS transistor provided through the feedback path.

19 Claims, 7 Drawing Sheets

(56) References Cited

U.S. PATENT DOCUMENTS

| | | | | |
|---|---|---|---|---|
| 2015/0365079 | A1 * | 12/2015 | Tsai | H03K 19/017509 327/306 |
| 2020/0373916 | A1 | 11/2020 | Chen et al. | |
| 2023/0221789 | A1 | 7/2023 | Samson et al. | |
| 2023/0262970 | A1 * | 8/2023 | Yamada | H10B 20/387 257/350 |
| 2024/0137022 | A1 * | 4/2024 | Zhang | H03K 3/037 |

* cited by examiner

30

HV HV HV HV

HIGH VOLTAGE TRANSFER DEVICE AND A MEMORY DEVICE INCLUDING THE SAME

CROSS-REFERENCE TO RELATED APPLICATION

This application claims priority to Korean Patent Application No. 10-2023-0125013, filed in the Korean Intellectual Property Office on Sep. 19, 2023, the disclosure of which is incorporated by reference herein in its entirety.

BACKGROUND

Techniques related to a semiconductor device have experienced remarkable growth and continuous development around the world due to active demands of semiconductor users and continuous efforts of semiconductor manufacturers. The semiconductor manufacturers are striving to make semiconductor elements even smaller, more highly integrated, and larger in capacity, and accelerating research and development to obtain a higher speed, while performing a more stable and a smooth operation.

A one-time programmable (OTP) memory device stores data in a plurality of OTP memory cells, each of which may have an un-programmed state or a programmed state. The OTP memory cell does not lose programmed data even when power is removed, and has an irreversible property in which reprogramming is not allowed. According to such a property, in many cases, the OTP memory is increasingly utilized in electronic devices.

SUMMARY

In general, in some aspects, the present disclosure is directed toward a memory device and an electronic device having improved element performance and reliability, while reducing an inhabited area. Additionally, the present disclosure is directed toward a high voltage transfer device that prevents a program voltage from being instantaneously transferred to a memory cell.

According to some aspects of the present disclosure, a high voltage transfer device comprises a first PMOS transistor and a second PMOS transistor which are connected in series between an external high voltage terminal and an internal voltage terminal, an enable circuit which generates a feedback voltage in accordance with an enable signal and provides the feedback voltage to the gate of the second PMOS transistor, and a level shifter which receives input of the feedback voltage and generates a gate voltage of the first PMOS transistor.

According to some aspects of the present disclosure, an electronic device comprises an OTP memory cell which includes a program transistor and a read transistor; and a high voltage transfer device which level-shifts an external high voltage to an internal voltage, wherein the high voltage transfer device includes a first PMOS transistor whose one end is connected to an external high voltage terminal, a second PMOS transistor, one end of which is connected to the other end of the first PMOS transistor, and the other end of which is connected to a gate of the program transistor, an enable circuit which receives the enable signal and generates a gate voltage of the second PMOS transistor and a level shifter which is connected to the enable circuit by a feedback path, and generates a gate voltage of the first PMOS transistor on the basis of the gate voltage of the second PMOS transistor provided through the feedback path.

According to some aspects of the present disclosure, a memory device comprises an OTP memory cell which includes a program transistor and a read transistor; and a high voltage transfer device which includes a first PMOS transistor whose one end is connected to an external high voltage terminal, and a second PMOS transistor whose one end is connected to the other end of the first PMOS transistor and the other end is connected to a gate of the program transistor, wherein the high voltage transfer device generates a gate voltage of the second PMOS transistor, when the enable signal is activated, the high voltage transfer device generates a gate voltage of the first PMOS transistor corresponding to the gate voltage of the second PMOS transistor, and when the second PMOS transistor and the first PMOS transistor are sequentially driven, the high voltage transfer device provides the external high voltage to a gate terminal of the program transistor in a stepwise manner.

BRIEF DESCRIPTION OF THE DRAWINGS

Exemplary implementations will be more clearly understood from the following description, taken in conjunction with the accompanying drawings.

DETAILED DESCRIPTION

Hereinafter, exemplary implementations will be described in detail with reference to the accompanying drawings.

In the present disclosure, one side or one direction and the other side or the other direction are used as relative concepts to facilitate understanding of the technical idea of the present invention. Accordingly, “one end” and “the other end” do not refer to a specific direction, location, or component, but are interchangeable with each other. For example, “one end” may be interpreted as “the other end,” and “the bother end” may be interpreted as “one end.” Accordingly, it is also possible to express “one end” as “first” and “the other end” as “second”, and it is also possible to express “the other end” as “first” and “one end” as “second”. However, in some implementations, “one end” and “the other end” are not mixed. In some implementations, both ends refer to both one side and the other side.

Figure 1:
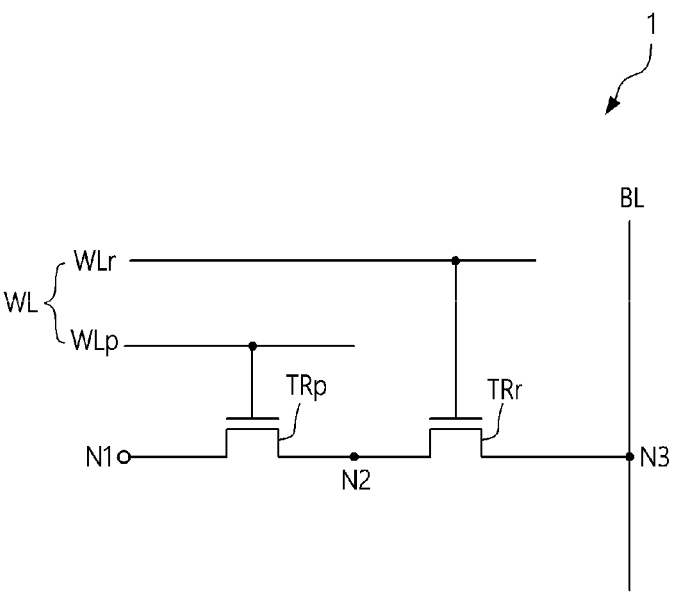
FIG. 1 is a circuit diagram schematically showing an exemplary OTP memory cell.
Figure 2:
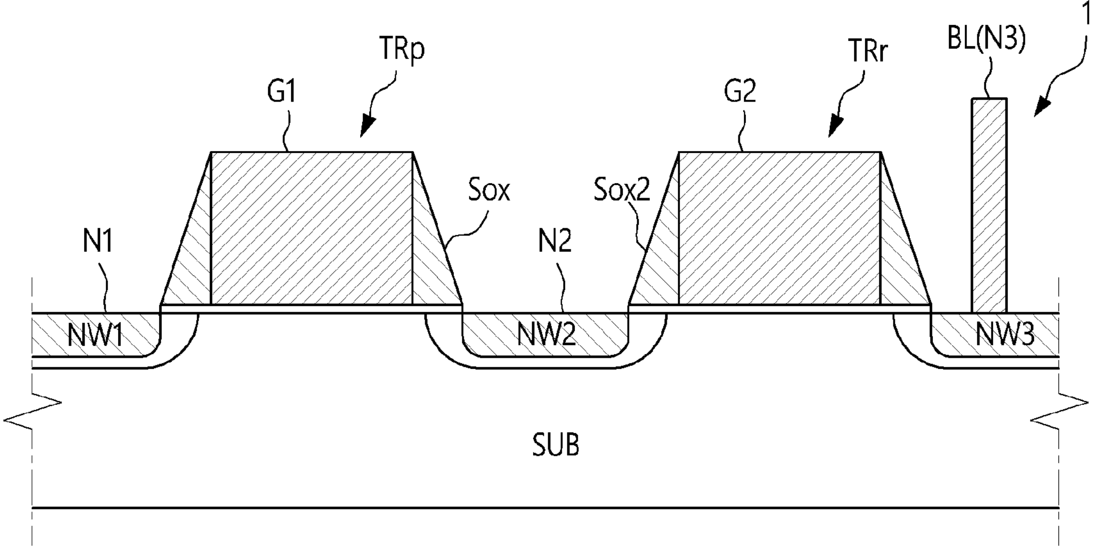
FIG. 2 is a cross-sectional view showing the OTP memory cell of FIG. 1.

FIG. 1 is a circuit diagram schematically showing an exemplary OTP memory cell according to some implementations. FIG. 2 is a cross-sectional view showing the OTP memory cell of FIG. 1 according to some implementations.

In FIGS. 1 and 2, the OTP memory cell is an independent memory cell device, may be implemented and packaged as a single chip, or may be implemented and packaged as a single chip (e.g., SoC (System on as a chip)) together with another circuit, for example, a memory, a processing core, or the like.

In FIGS. 1 and 2, the OTP memory cell 1 may be implemented in the form of an array arranged in a plurality of rows and columns. Each of the OTP memory cells is connected to a word line WL and a bit line BL, and may be placed at an intersection of a plurality of word lines and a plurality of bit lines. The word line WL may include two or more lines.

The OTP memory cell 1 may have a non-programmed state or a programmed state, and may store corresponding data depending on a potential state that the OTP memory cell 1 has. The OTP memory cells may have the plurality of programmed states to store data corresponding to the plurality of bits. Hereinafter, the description will be provided on the assumption that the OTP memory cell 1 has one programmed state, the non-programmed cell stores '0', and programmed cell stores '1'.

Referring to FIGS. 1 and 2, the OTP memory cell 1 may include a program transistor TRp and a read transistor TRr. The program transistor TRp is a type of anti-fuse device, and is a structure whose conductive state may be changed from a non-conducting state to a conducting state, and may change from a high resistance state to a low resistance state in response to an electrical stress, such as a program voltage or current. The programing voltage may be applied in the form of a pulse of several to several tens of μs. In some implementations, such an anti-fuse device may be implemented as a simple capacitor structure or as a transistor structure.

A program word line WLp may be connected to a gate of the program transistor TRp. A N2 node is a common node between a drain of the program transistor TRp and a source of the read transistor TRr, and a N1 node, that is, a source side of the program transistor TRp, may be floating, or the source N1 and the drain and N2 may be connected to each other.

A read word line WLr may be connected to the gate of the read transistor TRr. The N2 node is connected to the source terminal of the read transistor TRr, and a N3 node may be connected to the bit line BL as the drain terminal of the read transistor TRr. The read transistor TRr performs a switching function, and when an operating voltage is applied to the gate of the read transistor TRr through the read word line WLr, the read transistor TRr may be turned on.

Before a program voltage is applied to the gate of the program transistor TRp, a high resistance state is maintained between the gate and the source by a gate oxide film. Accordingly, even if a predetermined voltage is applied to the gate of the program transistor TRp and the bit line BL, and the operating voltage is applied to the gate of the read transistor TRr, the current flowing through the bit line BL is relatively very small.

When the program voltage is applied to the gate G1 of the programming transistor TRp, a gate oxide film Sox between the gate and the source is broken down to form a current path between the gate and the source. As a result, when the high resistance state between the gate G1 and the source S transitions to the low resistance state, a predetermined voltage is applied to the gate of the program transistor TRp and the bit line BL, and when the operating voltage is applied to the gate of the read transistor TRr, the current flowing through the bit line BL may be relatively large due to the low resistance state. In this way, the OTP memory cell 1 may store data through application of a high program voltage.

However, when the program voltage applied to the gate G1 of the program transistor TRp is instantaneously transferred, the gate oxide film Sox may be broken down not between the gate G1 and the source S, but between the gate G1 and the bulk SUB. Due to this abnormal breakdown of the oxide film, an excessive bulk current may flow through the OTP memory cell 1, which causes the charge that needs to flow to the source region NW2 shared with the read transistor TRr to disappear, reduces the bit line current, and a read failure may occur.

Accordingly, for the reliability of the OTP memory cell 1, a high voltage transfer device to the OTP memory cell 1 is required to prevent occurrence of abnormal gate oxide breakdown.

Figure 3:
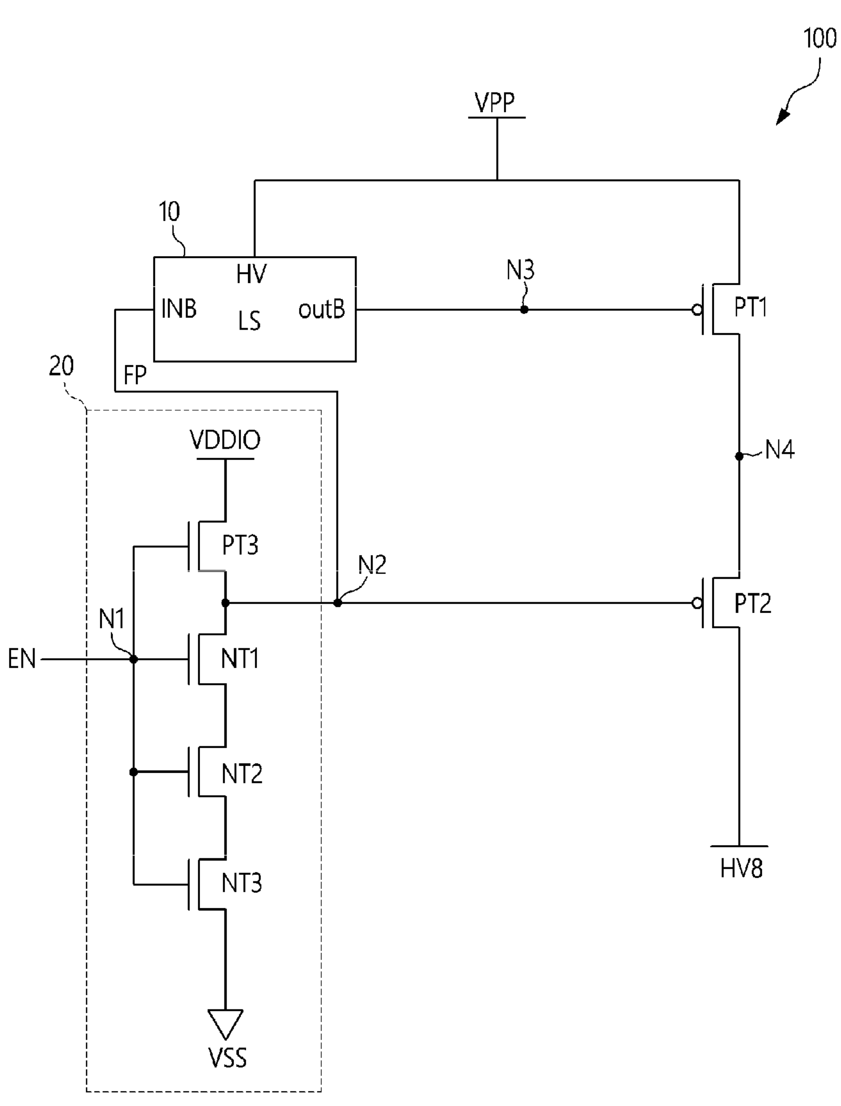
FIG. 3 is a circuit diagram showing an exemplary high voltage transfer device connected to the OTP memory cell of FIG. 1.
Figure 4:
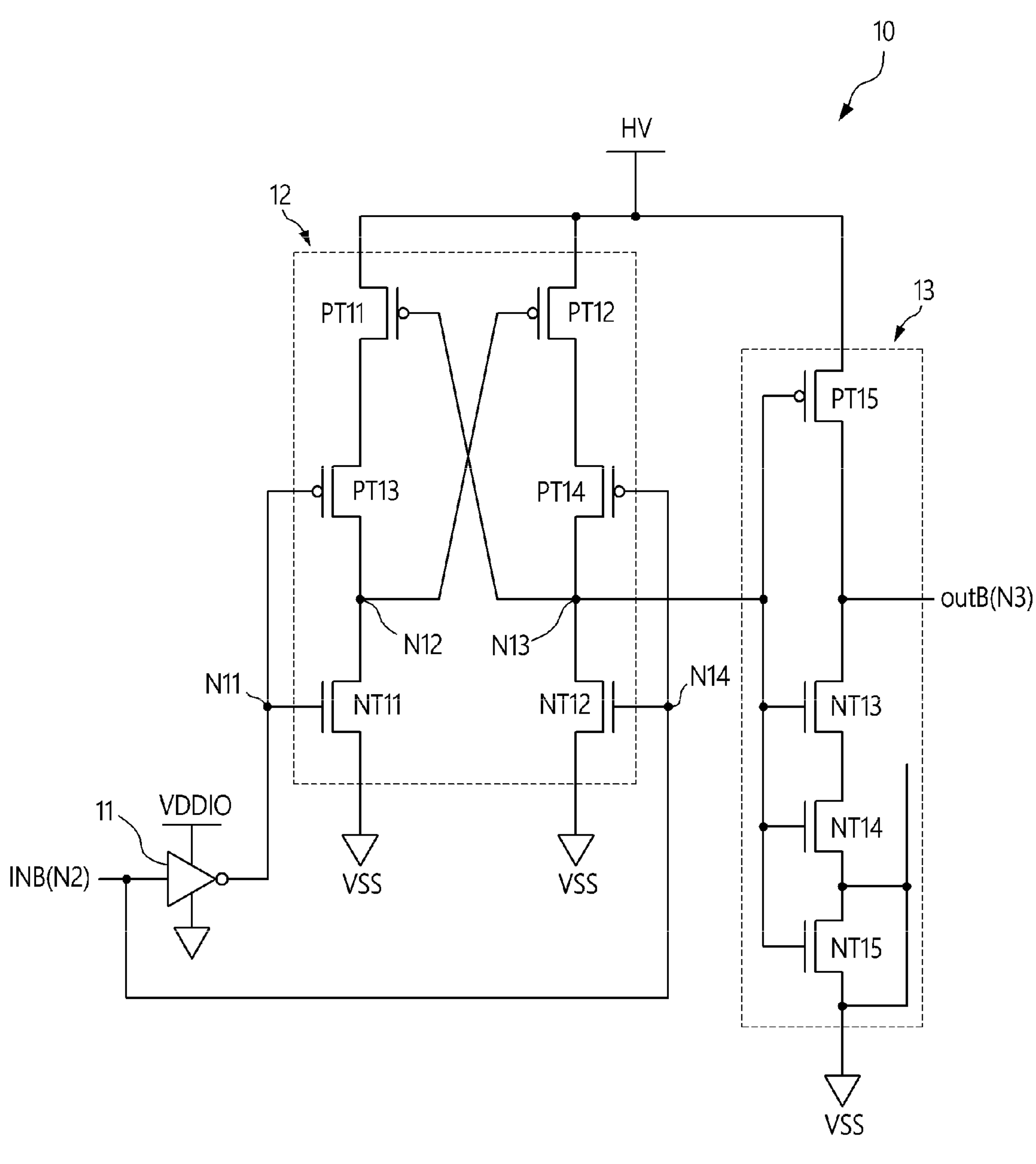
FIG. 4 is a circuit diagram showing an exemplary level shifter circuit of the high voltage transistor device of FIG. 3.

FIG. 3 is a circuit diagram showing an exemplary high voltage transfer device connected to the OTP memory cell of FIG. 1 according to some implementations. FIG. 4 is a circuit diagram showing an exemplary level shifter circuit of the high voltage transistor device of FIG. 3 according to some implementations.

In FIG. 3, the high voltage transfer device 100 includes a level shifter 10, an enable circuit 20, a first PMOS transistor PT1, and a second PMOS transistor PT2. The level shifter 10 is connected between an external high voltage terminal VPP and a ground voltage terminal VSS, receives input of a feedback voltage FP, and outputs a gate voltage outB of the first PMOS transistor PT1.

The enable circuit 20 is connected between a power supply voltage terminal VDDIO and the ground voltage terminal VSS, receives input of the enable signal EN, and outputs the feedback voltage FP to the input terminal INB of the level shifter 10 and the gate terminal of the second PMOS transistor PT2.

The first PMOS transistor PT1 and the second PMOS transistor PT2 are connected in series between the external high voltage terminal VPP (or an external node) and an internal voltage supply terminal HV8 (or an internal node). The gate of the first PMOS transistor PT1 receives the output voltage outB of the level shifter 10, and the gate of the second PMOS transistor PT2 receives the feedback voltage FP of the enable circuit 20.

The first PMOS transistor PT1 and the second PMOS transistor PT2 are power transistors for transferring an external high voltage to an internal voltage. In some implementations, the first PMOS transistor PT1 and the second PMOS transistor PT2 may be transistors that are greater than other transistors included in the level shifter 10 or the enable circuit 20. For example, the first PMOS transistor PT1 and the second PMOS transistor PT2 may each be implemented as a strong transistor having a width of about 400 μm. The second PMOS transistor PT2 delays the feedback voltage FP by a coupling capacitor generated between a common node N4 with the first PMOS transistor PT1 and the gate node N2, such that the external high voltage VPP is transferred to an internal voltage HV8 by a sequential pipeline operation.

The enable circuit 20 includes a plurality of sub-transistors connected in series between the power supply terminal VDDIO and the ground voltage terminal VSS according to some embodiments, and the enable signal EN may be applied to all the gate terminals of the plurality of sub-transistors. The plurality of sub-transistors may include, for example, a first P-type sub-transistor PT3 connected between the power supply terminal VDDIO and the output node N2 of the enable circuit 20, and a plurality of first N-type sub-transistors NT1, NT2, and NT3 connected in series between the output node N2 of the enable circuit 20 and the ground voltage terminal VSS. In some implementations, the plurality of first N-type sub-transistors may have a smaller size than the first and second PMOS transistors PT1 and PT2, which are power transistors. For example, the first N-type sub-transistor may be implemented as a weak transistor having a width of about 2 km.

In FIG. 4, the level shifter 10 may be implemented as an inverter 11, a level shifter circuit 12, and a buffer circuit 13, according to some implementations. The buffer circuit 13 may buffer the signal provided to the N13 node and output it to the N3 node. In some implementations, the buffer circuit 13 may be implemented as an inverter. In some implementations, the buffer circuit 13 may include a second P-type sub-transistor and a plurality of second N-type sub-transistors connected in series between the external high voltage supply terminal HV and the ground voltage terminal VSS. The gates of the second P-type sub-transistor PT15 and the plurality of second N-type sub-transistors NT13, NT14, and NT15 are connected to the N13 node, and may be provided with the output voltage of the level shifter circuit 12. According to some implementations, the second N-type sub-transistor may be used as one N-type sub-transistor or as the plurality of N-type sub-transistors NT13, NT14, and NT15 connected in series. In the plurality of N-type sub-transistors, the sources and drains of the N-type sub-transistors of the number set according to the device characteristics may be connected. In some implementations, the N-type sub-transistor may have a smaller size than the power transistors PT1 and PT2 of the high voltage transfer device 100. For example, the N-type sub-transistor may be implemented as a weak transistor having a width of about 2 μm.

The inverter 11 is connected between the power supply terminal VDDIO and the ground voltage terminal VSS, inverts feedback voltage FP supplied to the input node N2 of the level shifter 10, and outputs it to the node N11.

The level shifter 10 converts the level of the inverted feedback voltage FPB supplied to the N11 node, and outputs it to the N13 node. The level shifter 10 includes a level shifter circuit 12 that includes a plurality of cross-connected P-type transistors and a plurality of N-type transistors connected to the P-type transistors. The level shifter circuit 12 includes a first string and a second string connected in parallel with each other. The first string includes P-type transistors PT11 and PT13 and an N-type transistor NT11 connected in series between the external high voltage supply terminal HV and the ground voltage terminal VSS, and the second string includes P-type transistors PT12 and PT14 and an N-type transistor NT12 connected in series between the external high voltage supply terminal HV and the ground voltage terminal VSS. A gate terminal of the PT11 transistor is connected to the N13 node (a common node of the PT14 transistor and the NT12 transistor and an output node of the level shifter circuit 12), a gate terminal of the PT12 transistor is connected to the N12 node (a common node of the PT13 transistor and the NT11 transistor), and the first string and the second string are cross-coupled to each other. The gate terminals of the PT13 transistor and the NT11 transistor of the first string are connected to the output terminal N11 of the inverter 11. The gate terminals of the PT14 and NT12 transistors of the second string are connected to the input terminal N2 of the inverter 11.

Figure 5:
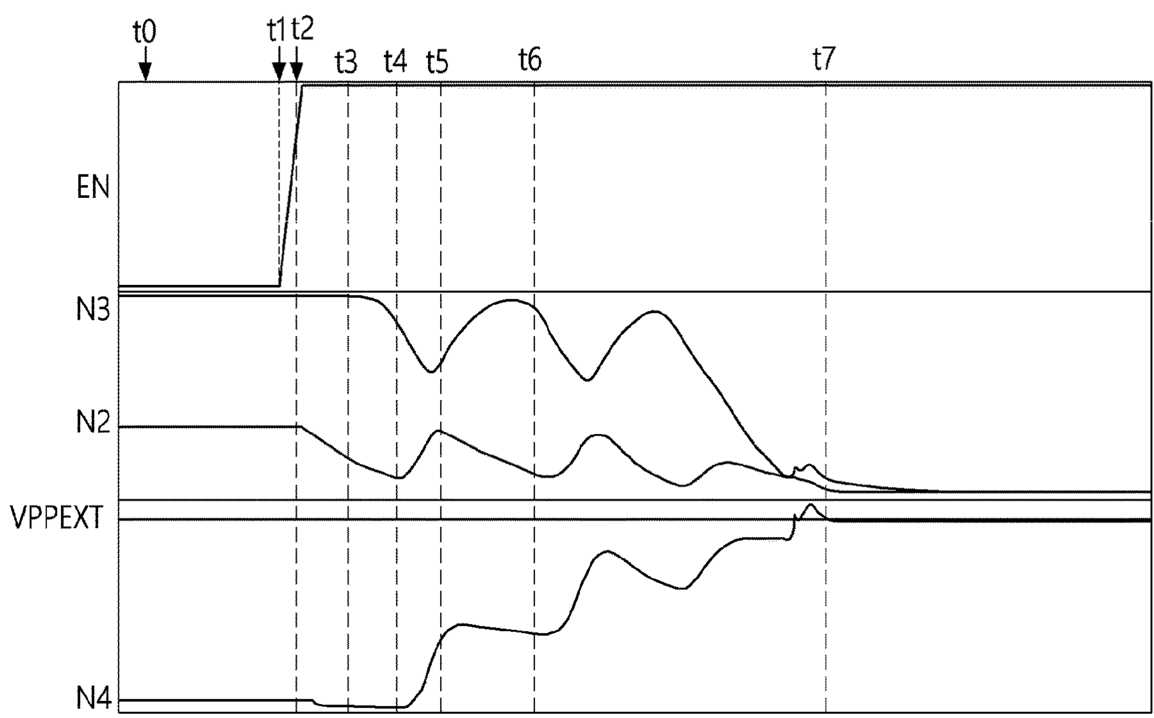
FIG. 5 is a signal diagram showing an example operation of the high voltage transfer device of FIG. 3.

FIG. 5 is a signal diagram showing the operation of the high voltage transfer device of FIG. 3 according to some implementations. In FIG. 5 together with FIGS. 3 and 4, when the enable signal EN is low from a time point t0, the enable circuit 20 is maintained in an inactive state, and when the signal becomes high from a time point t1 to a time point t2, the enable circuit 20 inverts the enable signal EN and outputs the feedback voltage FP to the N2 node between the time point t2 and a time point t3. In some implementations, the feedback voltage FP level of the N2 node decreases from the time point t2 to the time point t3. Since the enable circuit 20 includes a weak N-type transistor connected in series between the output terminal N2 and the ground power supply terminal VSS, the feedback voltage FP of the N2 node is slowly discharged by the weak N-type transistor.

As the voltage level of the N2 node gradually decreases, it may transition from high to low at the time point t3. The gate voltage of the first PMOS transistor PT1 is level-shifted and changes in accordance with the voltage change of the N2 node connected to the input node INB of the level shifter 10. For example, at the time point t3 when a certain period of time has elapsed since the feedback voltage FP level decreased, the output voltage outB of the level shifter 10 at the N3 node begins to discharge. While the voltage level of the N3 node decreases, the first PMOS transistor PT1 is gradually turned on, and charges from the external high voltage VPP flow into the N4 node. Since the N4 node is connected to the source terminal of the second PMOS transistor PT2, when the source voltage of the second PMOS transistor PT2 increases between a time point t4 and a time point t5, the feedback voltage FP level of the N2 node increases again due to the source-gate coupling of the second PMOS transistor PT2.

When the feedback voltage FP level which is input to the N2 node rises and becomes high I in the level shifter 10, the level of the output voltage outB that is output to the N3 node from the time point t5 after being delayed by the level shifting operation also subsequently rises. The first PMOS transistor PT1 is gradually turned on again according to the output voltage levels outB and N3, and the charge due to the external high voltage VPP flows into the N4 node. Accordingly, the voltage level at the N4 node further increases up to the time point t5. When the voltage level of the N4 node increases between the time point t5 and a time point t6, the internal voltage HV8 increases together with the N4 node as the second PMOS transistor PT2 turns on.

At the time point t5, when the voltage level of the N4 node increases and the voltage level of the N2 node becomes high, the second PMOS transistor PT2 is turned off. Additionally, when the second PMOS transistor PT2 is turned off, the charges accumulated in the N2 node begin to be slowly discharged through the weak N-type transistors NT1, NT2, and NT3 of the enable circuit 20.

When the voltage level of the N2 node is discharged and becomes low at the time point t6, the level shifter 10 also lowers the output voltage outB of the N3 node on the basis of the feedback voltage FP of the N2 node.

Thereafter, the high voltage transfer device repeats the operation from the time point t6 to the time point t7 described above from the time point t2 to the time point t6, and when the external high voltage VPPEEXT is completely transferred to the internal voltage HV8, it stops the feedback operation, and maintains both the first PMOS transistor PT1 and the second PMOS transistor PT2 in the turned-on state.

For example, when the enable signal EN is activated, the high voltage transfer device generates the gate voltage of the second PMOS transistor PT2 connected to the internal voltage terminal, and generates the gate voltages N3 and outB of the first PMOS transistor PT1 to correspond to the gate voltage FP of the second PMOS transistor. That is, after the second PMOS transistor PT2 is driven, the first PMOS transistor PT1 is sequentially driven to gradually provide the external high voltage VPP to the gate terminal TRp-G1 of the program transistor as the internal voltage HV8.

In some implementations, the enable circuit 20 receives the enable signal to generate the gate voltage of the second PMOS transistor PT2. For example, since the enable circuit 20 includes a plurality of first N-type sub-transistor circuits smaller than the first PMOS transistor PT1 or the second PMOS transistor PT2, when the enable signal EN is provided to the gates of the plurality of first N-type sub-transistors, the gate voltage of the second PMOS transistor transitions with a slow delay depending on the size of the N-type sub-transistor.

The level shifter 10 is connected between the external high voltage terminal VPP and the ground voltage terminal VSS, performs the level shifting operation on the basis of the gate voltage of the second PMOS transistor PT2, and generates the gate voltage of the first PMOS transistor PT1. Accordingly, the second PMOS transistor PT2 causes charge to flow into the program transistor gate from the drain terminal of the first PMOS transistor PT1 in a stepwise manner.

The level shifter 10 includes a plurality of second N-type sub-transistors that generate a gate voltage for the first PMOS transistor PT1 in a buffer circuit, and slowly delays and transitions the gate voltage of the first PMOS transistor PT1 according to the output signal N13 of the level shifter circuit 12. For example, the first PMOS transistor slowly causes the charge to flow from the external high voltage terminal VPPEXT to the drain terminal according to the gate voltage of the first PMOS transistor.

In some implementations, the high voltage transfer device forms a feedback loop in which the second PMOS transistor PT2 is first operated by the signal of the N2 node, and then the first PMOS transistor PT1 is operated by the level shifter 10, thereby slowly converting the external high voltage VPP into the internal voltage HV8 and providing it to the OTP memory cell 1, and thus, the OTP memory cell operates may operate more reliably without abnormal gate oxide breakdown.

In some implementations, the high voltage transfer device occupies less layout area by implementing the level shifter 10 and the enable circuit 20 connected to a feedback path, and thus, a PnR (Place and Routing) may be efficient when designing the OTP memory device.

Figure 6:
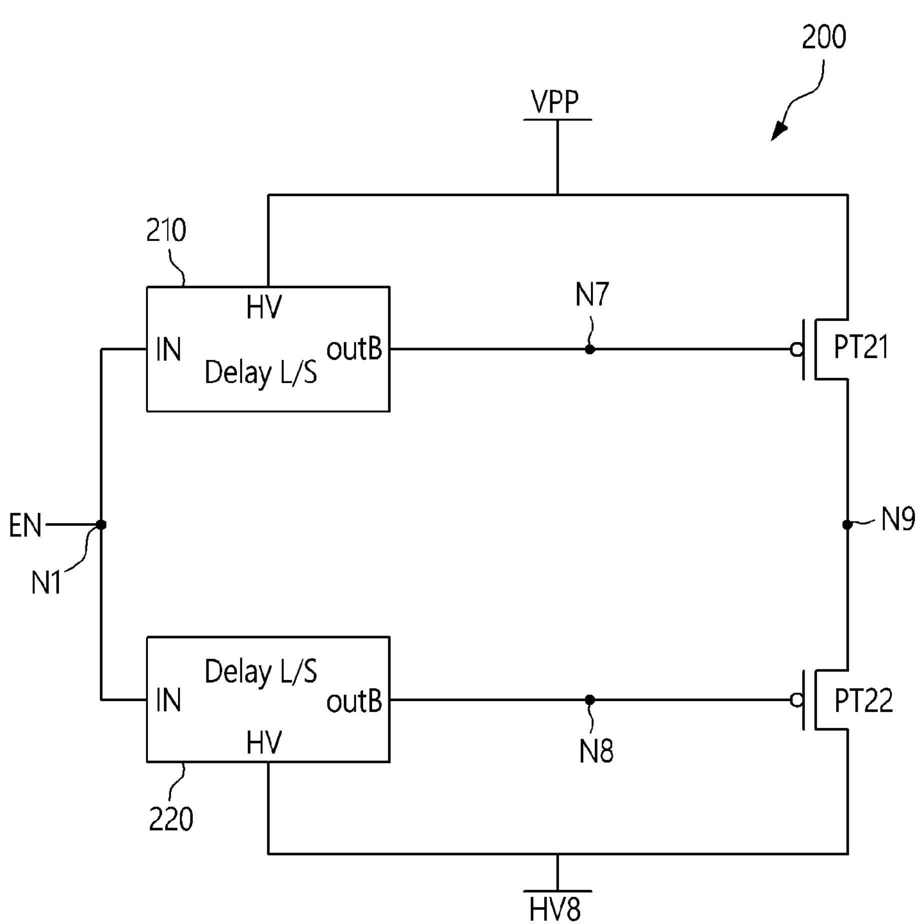
FIG. 6 is a circuit diagram showing an exemplary high voltage transfer device connected to the OTP memory cell of FIG. 1.
Figure 7:
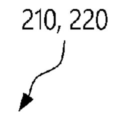
FIG. 7 is a circuit diagram showing an exemplary delay level shifter of the high voltage transfer device of FIG. 6.
Figure 7:
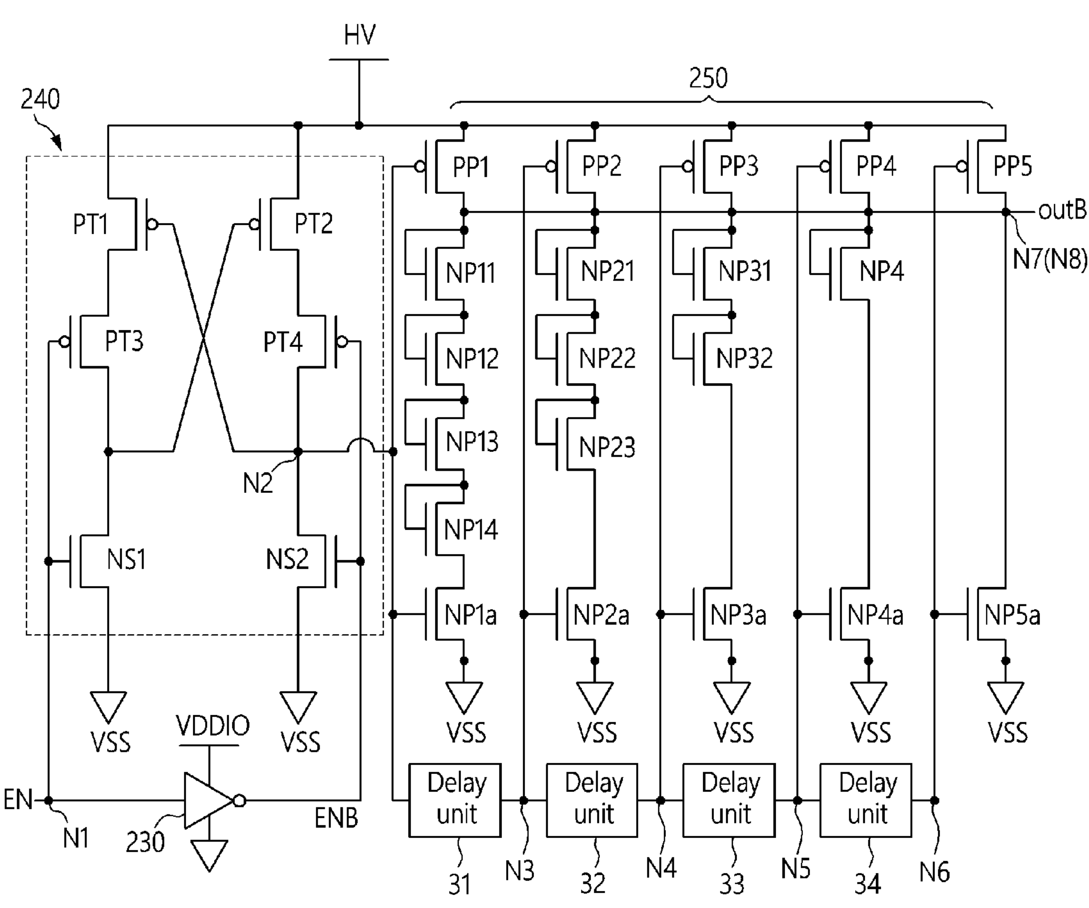
Figures 8, 9:
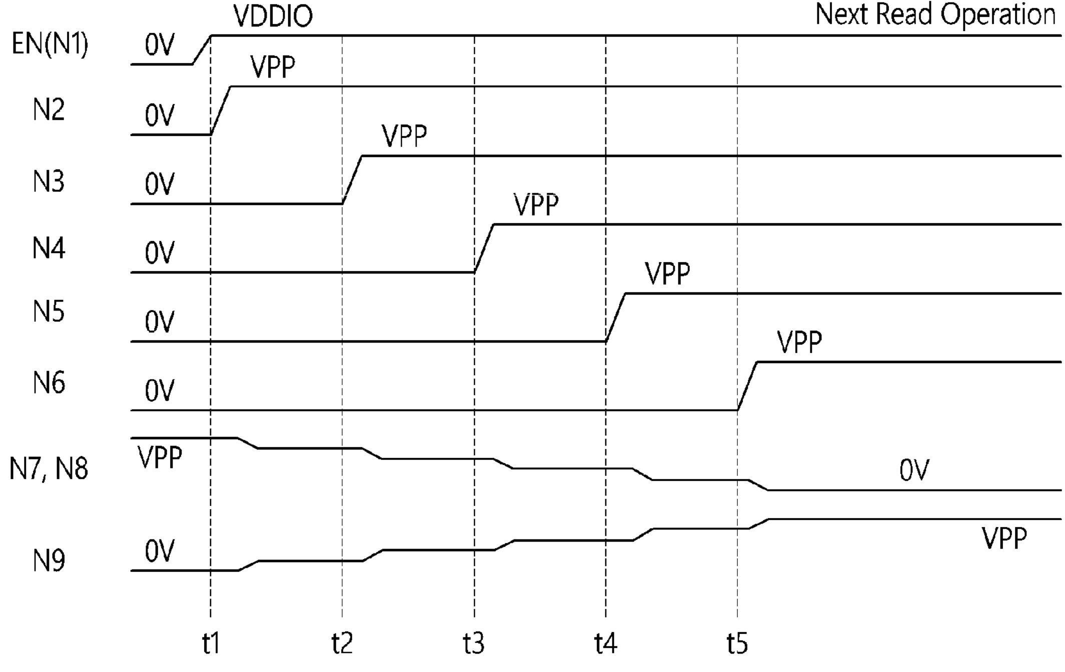
FIG. 8 shows an exemplary delay circuit of the high voltage transfer device of FIG. 6.
FIG. 9 is a signal diagram showing an exemplary operation of the high voltage transfer device of FIG. 6.

FIG. 6 is a circuit diagram showing an exemplary high voltage transfer device connected to the OTP memory cell of FIG. 1 according to some implementations. FIG. 7 is a circuit diagram showing an exemplary delay level shifter of the high voltage transfer device of FIG. 6 according to some implementations. FIG. 8 shows an exemplary delay circuit of the high voltage transfer device of FIG. 6 according to some implementations.

In FIG. 6, the high voltage transfer device may include two delay level shifters (hereinafter referred to as DLSs 210 and 220) and two PMOS transistors PT21 and PT22.

The first delay level shifter 210 is connected between the external high voltage VPP terminal and the ground voltage terminal VSS, receives input of the enable signal EN at the node N1, and outputs it to a node N7. The second delay level shifter 220 is connected between the internal voltage HV8 terminal and the ground voltage VSS terminal, receives the input of the enable signal EN at the N1 node, and outputs the received enable signal EN to a N8 node.

The first PMOS transistor PT21 and the second PMOS transistor PT22 are connected in series between the external high voltage VPP terminal and the internal voltage HV8, and the gate of the first PMOS transistor PT21 is connected to the N7 node, the gate of the second PMOS transistor PT22 is connected to the N8 node.

Each of the first and second delay level shifters 210 and 220 (hereafter DLS) may be implemented as in FIG. 7 according to some implementations. In FIG. 7, the DLSUs 210 and 220 may include an inverter 230, a level shifter circuit 240, a diode connection series circuit 250, and a plurality of delay circuits 31, 32, 33 and 34.

The inverter 230 is connected between the power supply terminal VDDIO and the ground voltage terminal VSS, and inverts the enable signal EN supplied to the input nodes N1 and IN to generate an inverted enable signal ENB.

The level shifter circuit 240 converts the levels of the enable signal EN and the inverted enable signal ENB and outputs them to the N2 node.

The level shifter circuit 240 includes a plurality of cross-connected P-type transistors and a plurality of N-type transistors connected to the P-type transistors. The level shifting circuit includes a first string and a second string connected in parallel with each other. The first string includes P-type transistors PT1 and PT3 and a N-type transistor NS1 connected in series between the high voltage terminal HV and the ground voltage terminal VSS, and the second string includes P-type transistors PT2 and PT4 and an N-type transistor NS2 connected in series between the high voltage terminal HV and the ground voltage terminal VSS. The gate terminals of the PT3 transistor and the NS1 transistor are connected to the N1 node and the enable signal EN is applied thereto, and the gate terminals of the PT4 transistor and the gate terminal of the NS2 transistor are connected to the output node of the inverter circuit 230 and an inverted enable signal ENB is applied thereto. The gate terminal of the PT1 transistor is connected to the N2 node (a common node of the PT4 transistor and the NS2 transistor and an output node of the level shifter circuit), the gate terminal of the PT2 transistor is connected to the common node of the PT3 transistor and the NS1 transistor, and the first string and the second string are cross-coupled to each other.

The diode connection series circuit 250 includes a plurality of diode connection strings. The diode connection string includes, for example, a P-type transistor PP1 connected in series between the high voltage terminal HV and the ground voltage terminal VSS, at least one N-type diode connection transistor string NPxy (x and y are natural numbers), and an N-type transistor NPka (k is a natural number) which is connected between the ground voltage terminal and one end of the diode connection string, and receives the output signal of the level shifter 240 or the output signal of the delay circuit 30 at the gate.

For example, a first diode connection string includes a P-type transistor PP1 whose gate is connected to the output node N2 of the level shifter circuit, four N-type diode connection transistors NP11, NP12, NP13 and NP14, and an N-type transistor NP1*a* whose gate is connected to the N2 node. The input signal N2 of the first diode connection string is output to the N3 node after being delayed through the delay circuit 31. The output signal of the first diode connection string is output through a common node N7 of the P-type transistor PP1 and the first N-type diode connection transistor NP11 of the N-type diode connection transistor strings.

A second diode connection string includes a P-type transistor PP2 whose gate is connected to the N3 node, three N-type diode connection transistors NP21, NP22 and NP23, and an N-type transistor NP2*a* whose gate is connected to the N3 node. The input signal N3 of the second diode connection string is output to the N4 node after being delayed through the delay circuit 32. The output signal of the second diode connection string is output through the common node N7 of the P-type transistor PP2 and the first N-type diode connection transistor NP21 of the N-type diode connection transistor strings.

A third diode connection string includes a P-type transistor PP3 whose gate is connected to the N4 node, two N-type diode connection transistors NP31 and NP32, and an N-type transistor NP3*a* whose gate is connected to the N4 node. The input signal N4 of the third diode connection string is output to the N5 node after being delayed through the delay circuit 33. The output signal of the third diode connection string is output through the common node N7 of the P-type transistor PP3 and the first N-type diode connection transistor NP31 of the N-type diode connection transistor strings.

A fourth diode connection string includes a P-type transistor PP4 whose gate is connected to the N5 node, one N-type diode connection transistor NP4, and an N-type transistor NP4*a* whose gate is connected to the N5 node. The input signal N5 of the fourth diode connection string is output to the N6 node after being delayed through the delay circuit 34. The output signal of the fourth diode connection string is output through a common node N7 of the P-type transistor PP4 and the first N-type diode connection transistor NP4 of the N-type diode connection transistor strings.

A fifth diode connection string includes a P-type transistor PP5 whose gate is connected to the N6 node, and an N-type transistor NP5*a* whose gate is connected to the N6 node.

The first diode connection string to the fifth diode connection string are connected in parallel with each other between the high voltage terminal HV and the ground voltage terminal VSS, and the output nodes of the first diode connection string to the fifth diode connection string are all commonly connected to the output node N7 or N8 of DLSUs 210 and 220.

The plurality of delay circuits (31, 32, 33, and 34) are circuits that sequentially delay the signal of the N2 node to the N6 node. According to some implementations, each of the delay circuits 31, 32, 33 and 34 includes a plurality of buffers, each connected between the high voltage terminal HV and the ground voltage terminal VSS, as in FIG. 8, and the output of the buffer and the input of the next buffer may be connected consecutively. For example, one delay circuit 30 may include an even number of inverters. For example, the first delay circuit 31 receives the signal of the N2 node and outputs it to the N3 node, the second delay circuits 32 receives the signal of the N3 node and outputs it to the N4 node, the third delay circuit 33 receives the signal of the N4 node and outputs it to the N5 node, and the fourth delay circuit 34 receives the signal of the N5 node and outputs it to the N6 node.

Since the operations of the inverter circuit 230 and the level shifter 240 are redundant with those explained in FIG. 4, the explanation thereof will not be provided. The DLSs 210 and 220 provide the level-converted signal of the N2 node to the gate of the first diode connection string, output the signal provided to the high voltage terminal HV to the N7 node, and delay the signal of the N2 node by the first delay circuit 31 and output it to the N3 node. Similarly, the DLSs 210 and 220 provide the signal of the N3 node to the gate of the second diode connection string, output the signal provided to the high voltage terminal HV to the N7 node, and delay the signal of the N2 node by the second delay circuits 32 and output it to the node N4. Next, the DLSs 210 and 220 provide the signal of the N4 node to the gate of the third diode connection string, output the signal supplied to the high voltage terminal HV to the N7 node, and delay the signal of the N4 node by the third delay circuit 33 and output it to the N5 node. The DLSs 210 and 220 provide the signal of the N5 node to the gate of the fourth diode connection string, output the signal supplied to the high voltage terminal HV to the N7 node, and delay the signal of the node N5 by the third delay circuit 33 and output it to the N6 node. The P-type transistor PP5 receives the signal of the N6 node at the gate and outputs it to the N7 node.

In some implementations, the high voltage terminal HV of the first delay level shifter 210 is connected to the external high voltage supply terminal VPP, and the output signals of the diode connection series circuit and the plurality of delay circuits 31, 32, 33 and 34 (hereinafter, 30) are output to the N7 node. Additionally, the high voltage terminal HV of the second delay level shifter 220 is connected to the internal voltage terminal HV8, and the output signals of the diode connection series circuit and the plurality of delay circuits 31, 32, 33 and 34 (hereinafter 30) are output to the N8 node.

The first P-type transistor PT21 and the second P-type transistor PT22 are connected in series between the external high voltage supply terminal VPP and the internal voltage terminal HV8 with the N9 node as a common node. The gate of the first P-type transistor PT21 is connected to the N7 node, the gate of the second P-type transistor PT22 is connected to the N8 node, and the external high voltage VPP is convert slowly into the internal voltage HV8 on the basis of the N7 node signal and the N8 node signal.

FIG. 9 is a signal diagram showing an exemplary operation of the high voltage transfer device of FIG. 6 according to some implementations. Referring to FIGS. 6 to 8 and 9, when the enable signal EN is applied to the N1 node in a low state at the time point t0, the N2 node and the N3 to N6 nodes, which are the output nodes of the delay circuit 30, may also be kept in the same low state as the N2 node.

When the enable signal EN transitions to high at the time point t1, the voltage level of the N2 node transitions to high by the inverter circuit 230, and the N3 node maintains a low state on the basis of the level state of the previous interval of the N2 node, and then transitions to high at the time point t2. The N4 node maintains the low state on the basis of the level state of the pervious interval of the N3 node and then transitions to high at the time point t3, the N5 node maintains the low state on the basis of the level state of the pervious interval of the N4 node and then transitions to high at the time point t4, the N6 node maintains a low state on the basis of the level state of the previous interval of the N5 node, and transitions to high at the time point t5.

In this way, when the N3, N4, N5, and N6 nodes sequentially transition from low (0V) to high (VPP) by the delay circuits 31, 32, 33, and 34, the output voltage N7 or N8 of the DLSUs 210 and 220 slowly transitions from high (VPP) to low (0V) in sequence, rather than instantaneously transitioning from high to low.

The first P-type transistor (in FIG. 6, PT1) and the second P-type transistor (in FIG. 6, PT2) are in the turned-off state when the N7 (or N8) node is high (VPP), and then may be turned on slowly as the voltage level of the N7 (or N8) node decreases in a stepwise manner. In addition, at the common node N9 of the first P-type transistor (in FIG. 6, PT1) and the second P-type transistor (in FIG. 6, PT2), when the voltage of the N7 (or N8) node decreases in a stepwise manner, as the charge slowly flows from the source region into the drain region, the voltage of the N9 node rises from low (0V) to high (VPP) in a stepwise manner.

When the voltage levels of the N7 and N8 nodes slowly decrease and are turned on, as the charge gradually flows into the gate of the program transistor (TRp of FIG. 2), the level of the internal voltage (voltage of the N9 node) gradually increases in a stepwise manner. When the voltage of the N8 node gradually decreases from the time point t2 to the time point t5, the second PMOS transistor (PT22 of FIG. 6) is gradually turned on, and the internal voltage HV8 increases together with the N9 node. For example, when the internal voltage HV8 slowly transitions from 0V to the high voltage (VPP), the gate oxide film of the program transistor may be normally broken down. Accordingly, the OTP memory cell may operate more reliably without breaking down the abnormal gate oxide film.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

What is claimed is:

1. A high voltage transfer device comprising:

a first PMOS transistor and a second PMOS transistor that are connected to each other in series between an external high voltage terminal and an internal voltage terminal;

an enable circuit configured to generate a feedback voltage based on an enable signal and provide the feedback voltage to a gate of the second PMOS transistor; and a level shifter configured to receive the feedback voltage and generate a gate voltage of the first PMOS transistor, wherein the enable circuit includes a first P-type sub-transistor and a plurality of first N-type sub-transistors, wherein the first P-type sub-transistor and the plurality of first N-type sub-transistors are connected in series between a power supply terminal and a ground voltage terminal, wherein the enable signal is configured to be applied to gate terminals of the first P-type sub-transistor and the plurality of first N-type sub-transistors, and wherein the feedback voltage is configured to be output to a common node of the first P-type sub-transistor and the plurality of first N-type sub-transistors.

2. The high voltage transfer device of claim 1, wherein the plurality of first N-type sub-transistors includes a transistor having a size that is smaller than a size of the first PMOS transistor and a size of the second PMOS transistor.

3. The high voltage transfer device of claim 1, wherein the level shifter includes:

an inverter circuit configured to invert the feedback voltage;

a level shifter circuit configured to level-shift and output the inverted feedback voltage as level-shifted feedback voltage; and a buffer circuit configured to buffer and output the level-shifted feedback voltage.

4. The high voltage transfer device of claim 3, wherein the buffer circuit includes a second P-type sub-transistor and a plurality of second N-type sub-transistors, the second P-type sub-transistor and the plurality of second N-type sub-transistors being connected in series between the external high voltage terminal and a ground voltage terminal, wherein gate terminals of the second P-type sub-transistor and the plurality of second N-type sub-transistors are connected to an output node of the level shifter circuit, and wherein a gate voltage of the first PMOS transistor is output to a common node of the second P-type sub-transistor and the plurality of second N-type sub-transistors.

5. The high voltage transfer device of claim 4, wherein each of the plurality of second N-type sub-transistors includes a transistor having a size that is smaller than a size of the first PMOS transistor and a size of the second PMOS transistor.

6. The high voltage transfer device of claim 4, wherein the plurality of second N-type sub-transistors are configured to connect a source terminal and a drain terminal of at least one second N-type sub-transistor connected to the ground voltage terminal.

7. The high voltage transfer device of claim 1, wherein the internal voltage terminal is connected to a gate of a program transistor of a one-time programmable memory cell.

8. An electronic device comprising:

a one time programmable (OTP) memory cell that includes a program transistor and a read transistor; and a high voltage transfer device configured to level-shift an external high voltage to an internal voltage, wherein the high voltage transfer device includes:

a first PMOS transistor having a first end connected to an external high voltage terminal;

a second PMOS transistor having a first end connected to a second end of the first PMOS transistor and a second end connected to a gate of the program transistor;

an enable circuit configured to receive an enable signal and generate a gate voltage of the second PMOS transistor; and a level shifter connected to the enable circuit by a feedback path and configured to generate a gate voltage of the first PMOS transistor based upon the gate voltage of the second PMOS transistor provided through the feedback path.

9. The electronic device of claim 8, wherein the enable circuit includes a plurality of first N-type sub-transistors, each having a size smaller than a size of the first PMOS transistor and a size of the second PMOS transistor, and wherein the gate voltage of the second PMOS transistor is configured to, based on the enable signal being supplied to gates of the plurality of first N-type sub-transistors, transition from high to low with a slow delay.

10. The electronic device of claim 9, wherein the enable circuit includes a first P-type sub-transistor and a plurality of first N-type sub-transistors, the first P-type sub-transistor and the plurality of first N-type sub-transistors being connected in series between a power supply terminal and a ground voltage terminal, wherein the enable signal is applied to gate terminals of the first P-type sub-transistor and the plurality of first N-type sub-transistors, and wherein the gate voltage of the second PMOS transistor is output to a common node of the first P-type sub-transistor and the plurality of first N-type sub-transistors.

11. The electronic device of claim 9, wherein, when the second PMOS transistor is turned on and the first PMOS transistor is turned on, based upon the gate voltage of the second PMOS transistor, the high voltage transfer device is configured to generate the internal voltage.

12. The electronic device of claim 8, wherein the level shifter includes:

an inverter circuit configured to invert the gate voltage of the second PMOS transistor;

a level shifter circuit configured to level-shift and output an output signal of the inverter circuit; and a buffer circuit configured to buffer an output signal of the level shifter circuit and output the buffered signal as a gate voltage of the first PMOS transistor.

13. The electronic device of claim 12, wherein the buffer circuit includes a second P-type sub-transistor and a plurality of second N-type sub-transistors that are connected in series between the external high voltage terminal and a ground voltage terminal, wherein the output signal of the level shifter circuit is configured to be applied to gate terminals of the second P-type sub-transistor and the plurality of second N-type sub-transistors, and wherein the gate voltage of the first PMOS transistor is configured to be output to a common node of the second P-type sub-transistor and the second N-type sub-transistor.

14. A memory device comprising:

a one time programmable (OTP) memory cell having a program transistor and a read transistor; and a high voltage transfer device includes a first PMOS transistor having a first end connected to an external high voltage terminal, and a second PMOS transistor having a first end connected to a second end of the first PMOS transistor and a second end connected to a gate of the program transistor, wherein the high voltage transfer device is configured to generate a gate voltage of the second PMOS transistor based on an enable signal being activated, wherein the high voltage transfer device is configured to generate a gate voltage of the first PMOS transistor corresponding to the gate voltage of the second PMOS transistor, and wherein the high voltage transfer device is configured to, based on the second PMOS transistor and the first PMOS transistor being sequentially driven, provide an external high voltage to a gate terminal of the program transistor in a stepwise manner.

15. The memory device of claim 14, wherein the high voltage transfer device includes:

an enable circuit configured to receive the enable signal and generate a gate voltage of the second PMOS transistor; and a level shifter configured to generate a gate voltage of the first PMOS transistor based upon a gate voltage of the second PMOS transistor provided through a feedback path from the enable circuit.

16. The memory device of claim 15, wherein the enable circuit includes a plurality of first N-type sub-transistors having a size smaller than a size of the first PMOS transistor and a size of the second PMOS transistor, and wherein the gate voltage of the second PMOS transistor is configured to, based on the enable signal being provided to gates of the plurality of first N-type sub-transistors, transition with a slow delay.

17. The memory device of claim 16, wherein the enable circuit includes a first P-type sub-transistor and a plurality of first N-type sub-transistors, the first P-type sub-transistor and the plurality of first N-type sub-transistors being connected in series between a power supply terminal and a ground voltage terminal, wherein the enable signal is configured to be supplied to gate terminals of the first P-type sub-transistor and the plurality of first N-type sub-transistors, and wherein a gate voltage of the second PMOS transistor is configured to be output to a common node of the first P-type sub-transistor and the plurality of first N-type sub-transistors.

18. The memory device of claim 15, wherein the level shifter includes:

an inverter circuit configured to invert the gate voltage of the second PMOS transistor;

a level shifter circuit configured to level-shift and output an output signal of the inverter circuit; and a buffer circuit configured to buffer an output signal of the level shifter circuit and output the buffered signal as a gate voltage of the first PMOS transistor.

19. The memory device of claim 18, wherein the buffer circuit includes a plurality of second N-type sub-transistors that are connected in series between the external high voltage terminal and a ground voltage terminal, wherein the plurality of second N-type sub-transistors each have a size smaller than a size of the first PMOS transistor and a size of the second PMOS transistor, wherein the first PMOS transistor is configured to cause charge to slowly flow from the external high voltage terminal to a drain terminal of the first PMOS transistor based on the gate voltage of the first PMOS transistor, and wherein the second PMOS transistor is configured to cause charge to flow from a drain terminal of the first PMOS transistor to the gate of the program transistor in a stepwise manner based on a change in the gate voltage of the second PMOS transistor that is output from the enable circuit.

* * * * *